United States Patent [19]

Pennell et al.

[11] Patent Number: 4,751,196
[45] Date of Patent: Jun. 14, 1988

[54] HIGH VOLTAGE THIN FILM TRANSISTOR ON PLZT AND METHOD OF MANUFACTURE THEREOF

[75] Inventors: Ronald C. Pennell, Chandler; Richard D. Catero, Mesa; Stephen L. Lovelis, Phoenix, all of Ariz.

[73] Assignee: Motorola Inc., Schaumburg, Ill.

[21] Appl. No.: 718,771

[22] Filed: Apr. 1, 1985

[51] Int. Cl.[4] ............................................. H01L 21/20
[52] U.S. Cl. .................................... 437/84; 437/41; 437/235; 437/966; 357/59
[58] Field of Search ................. 29/571, 580, 591; 357/4, 23.7, 84; 148/1.5; 437/41, 235, 233, 966, 84

[56] References Cited

U.S. PATENT DOCUMENTS 4,317,686  3/1982  Anand et al. ......................... 29/571

FOREIGN PATENT DOCUMENTS 58-90782  5/1983  Japan ......................................... 357/84

OTHER PUBLICATIONS

Douglas, "The Route to 3-D Chips", *High Technology*, Sep. 1983, pp. 55-59.
Colclaser, *Microelectronics Processing and Device Design*, John Wiley & Sons, New York, pp. 46-47.

Primary Examiner—Olik Chaudhuri
Assistant Examiner—Kevin McAndrews
Attorney, Agent, or Firm—Raymond J. Warren

[57] ABSTRACT

A high voltage thin film transistor structure and method are disclosed which make it possible to fabricate matrix displays with integrated pixel switches on PLZT substrates. A polysilicon transistor capable of withstanding more than 60 V across the source and drain and with a ratio of on to off current in excess of 10[3] is disclosed. The fabrication method disclosed is suitable for use with brittle and readily oxidizable PLZT substrates.

6 Claims, 1 Drawing Sheet

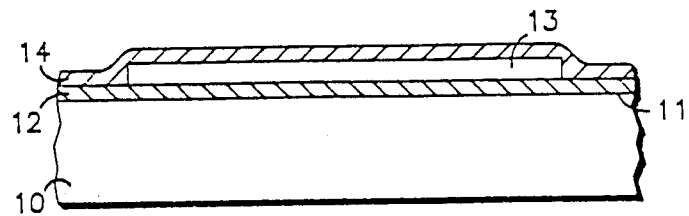
FIG. 1
FIG. 2
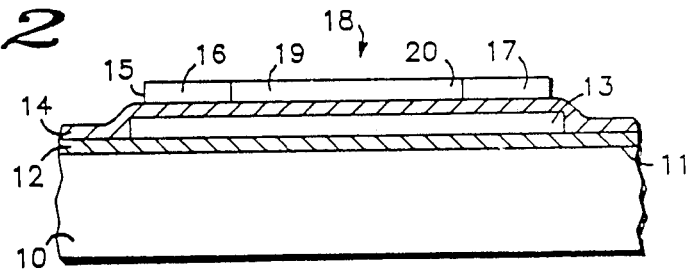
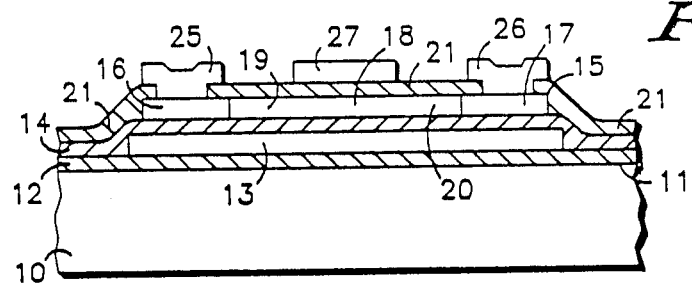
FIG. 3
FIG. 4
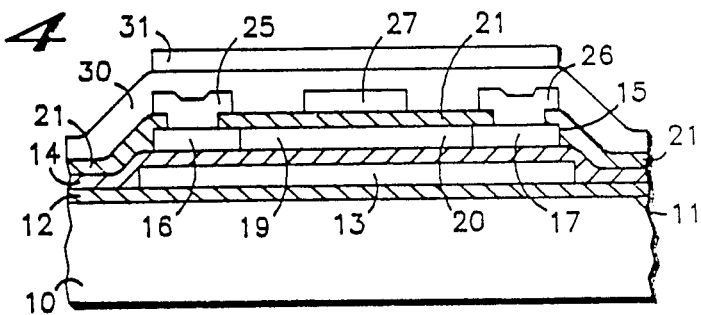

HIGH VOLTAGE THIN FILM TRANSISTOR ON PLZT AND METHOD OF MANUFACTURE THEREOF

FIELD OF THE INVENTION

The present invention relates, in general, to a high voltage thin film transistor and method of manufacture thereof. More particularly, the invention relates to such a transistor and method of manufacture thereof which are suitable for use with a PLZT substrate.

BACKGROUND OF THE INVENTION

The optical properties of PLZT (lead-lanthinumzirconium-titanate) materials have been widely known for a number of years. Specifically, it has been known that PLZT materials exhibit optical birefringence, a phenomenon which results in the rotation of the plane of polarization of polarized light passing through the material. Furthermore, it has been known that the birefringence of PLZT materials is related to the strength of an electric field imposed perpendicular to the direction of propagation of the light.

These well known properties of PLZT materials have lead to a large number of applications. Electronically controlled optical shutters are a prime example of such applications. However, the use of PLZT materials has been significantly limited by several factors. First, the electric field strength necessary to provide a useful amount of rotation of polarized light is relatively high. Practical devices using PLZT have operated at at least several tens of volts and most often several hundreds of volts. Second, PLZT materials tend to be extremely brittle and unable to withstand significant thermal shocks. These practical problems with PLZT materials have, up to the present, prevented their use as the substrate for large scale, flat panel displays. Such displays require a relatively large array of small, closely spaced display elements or pixels. In order to be able to individually control each pixel, it is necessary to have some type of active device, such as a transistor, at each pixel location. Such integrated displays are widely known using other technologies, such as liquid crystals or electroluminecent phosphors. These displays are feasible because it is possible to fabricate thin film transistors on appropriate substrates which are capable of handling the voltage necessary to drive liquid crystal and electroluminecent displays. However, it has not been possible to fabricate a silicon thin film transistor having sufficiently high voltage characteristics on a PLZT substrate.

SUMMARY OF THE INVENTION

Accordingly, it is an object of the present invention to provide a high voltage thin film transistor on a PLZT substrate.

It is a further object of the present invention to provide a method of manufacturing high voltage thin film transistors on PLZT substrates.

These and other objects and advantages of the present invention are provided by a thin film transistor structure and method of manufacture thereof which produce thin film transistors on optically birefringent PLZT substrates which transistors have breakdown voltages in excess of 60 volts. A polysilicon thin film transistor structure having an offset region between a gate electrode and each of a source and a drain region comprises a particular embodiment of the present invention. In addition to a high breakdown voltage, the structure and method of manufacture provide thin film transistors which exhibit a ratio of drain currents in the on and off states, respectively, in excess of $10^3$.

Finally, the method of manufacture of the present invention provides adequate yield when manufacturing thin film transistors on PLZT substrates to be commercially practicable.

These and other objects and advantages of the present invention will be apparent to one skilled in the art from the detailed description below taken together with the drawings.

BRIEF DESCRIPTION OF THE DRAWINGS

FIGS. 1–4 are cross-sectional views illustrating various stages in the manufacture of a high voltage thin film transistor on a PLZT substrate.

DETAILED DESCRIPTION OF THE INVENTION

FIG. 1 is a cross-sectional view illustrating an intermediate stage in the manufacture of a high voltage thin film transistor on a PLZT substrate 10. The fabrication of PLZT substrates suitable for use as part of flat panel display, for instance, is well known in the art. A typical substrate might be a composition of the formula $Pb_{.865}La_{.09}(Zr_{0.65}Ti_{0.35})O_3$. This material has certain properties which make it extremely difficult to apply conventional thin film transistor fabrication techniques. For instance, care must be taken when exposing the material to an oxidizing atmosphere to avoid the oxidation of lead from the substrate material, thus changing the properties of the substrate. The various cleaning steps which are applied throughout the fabrication of the transistor must also be carefully tailored to avoid damage to the substrate. Finally, rapid changes in temperature must be strictly avoided during the manufacturing process to avoid fractures of the PLZT substrate due to thermal stress. Details of particular procedures developed to address these problems will be disclosed in the description below where appropriate.

Throughout the early stages of the manufacture of the transistor it is necessary to apply a cleaning process to remove particulates and other contaminants. A particular cleaning process which has been found suitable for this purpose and which does not damage the PLZT substrate comprises exposure to a solution of $NH_4OH$ and $H_2O_2$ at approximately 70°–90° C. for approximately 30 minutes. This is followed by a rinse in ultrapure water and a spin dry cycle. This cleaning process may be assumed to be inserted in the process flow described wherever appropriate.

The first step in the process according to a particular embodiment of the present invention involves the deposition of a low temperature silicon dioxide layer 12 overlaying a major surface 11 of PLZT substrate 10. This may advantageously be carried out by conventional low pressure chemical vapor deposition (LPCVD) processes at a temperature of approximately 410° C. Oxide layer 12 is advantageously approximately 2500 Angstroms in thickness.

Immediately overlaying oxide layer 12 is a layer 13 of polysilicon. As shown in FIG. 1, polysilicon layer 13 has been deposited and patterned using conventional photoresist and etch techniques. Polysilicon layer 13 will form a light shield underlying the thin film transistor to reduce photo-generation of charge carriers in the transistor. Therefore, polysilicon layer 13 is defined to underlay the entirety of the transistor. It should be noted that the baking processes typically used to harden the photoresist in conventional processing must be carried out with care. The raising and lowering of the temperature to and from the bake temperature should be carried out slowly to avoid fracturing PLZT substrate 10. Polysilicon layer 13 may be advantageously deposited by a conventional LPCVD process at a temperature of approximately 630° C. to a thickness of approximately 5000 Angstroms. Polysilicon layer 13 is subjected to ion implantation using a phosphorous source to render it an effective light shield. This may be advantageously carried out at a beam energy of 100 KeV or higher to a doping concentration of $5 \times 10^{15}$ or higher.

In some cases it may be found that the use of a light shield underlying the thin film transistor is not necessary. In this case oxide layer 12 and polysilicon layer 13 may be eliminated.

The next step in the process is to deposit a second low temperature oxide layer 14 overlaying first oxide layer 12 and polysilicon layer 13. Of course, in the case in which no light shield is desired, oxide layer 14 will immediately overlie surface 11 of PLZT substrate 10. Oxide layer 14 may advantageously be a silicon dioxide layer deposited by an LPCVD process at approximately 420° C. to a thickness of approximately 2500 Angstroms. As is the case with oxide layer 12, oxide layer 14 is undoped.

Referring now to FIG. 2, a subsequent intermediate stage in the fabrication of a thin film transistor according to the principles of the present invention is illustrated in cross-section. A second polysilicon layer 15 has been deposited overlaying second oxide layer 14. In addition, second polysilicon layer 15 has been patterned, using conventional photoresist and etch processes, so that it is substantially co-extensive with first polysilicon layer 13. Second polysilicon layer 15 may have a thickness, for example, of approximately 5000 Angstroms.

Second polysilicon layer 15 which will form the source, drain and channel regions of the completed thin film transistor, may be deposited by either of several processes. First, a conventional LPCVD deposition process at approximately 630° C. may be used. At this temperature, layer 15 is deposited as polysilicon. Second, it may be advantageous to deposit layer 15 at a substantially lower temperature. For instance, a deposition temperature of 400° C. has been used in a plasma deposition process. At this temperature, the process deposits an amorphous silicon layer rather than a polysilicon layer. However, the subsequent gate annealing step will raise the temperature to a level sufficient to convert the amorphous silicon to a polysilicon layer. Excellent results have been obtained using an LPCVD deposition process at approximately 580° C. to form layer 15. It is found that improved electrical characteristics, such as carrier mobility, and reduced leakage current are realized using this deposition scheme.

Polysilicon layer 15 includes a source region 16, a drain region 17 and a channel region 18 interposed therebetween. In addition, offset regions 19 and 20 of channel region 18 are adjacent to source region 16 and drain region 17, respectively.

Source region 16 and drain region 17 are defined by conventional photoresist and ion implantation processes. The ion implantation is carried out using a phosphorous source and a beam energy of approximately 100 KeV. A doping concentration of source region 16 and drain region 17 may be approximately $5 \times 10^{15}$.

Channel region 18 may be doped by one of at least two methods. First, a "maskless" ion implantation may be used in which the entirety of second polysilicon layer 15 is exposed to the ion beam. Of course, this will increase the doping level in source region 16 and drain region 17. However, this does not have a significant effect on device performance. The advantage of the "maskless" method is the elimination of several photoresist processing steps. Second, a photoresist mask may be used to allow only the center portion of channel region 18, that is the portion which will eventually underlie the gate, to be doped. This leaves offset regions 19 and 20 either undoped or to be separately doped. In either case, the ion implantation of channel region 18 is carried out with a phosporous source and a beam energy of approximately 80 KeV. The doping concentration is in the range of $4 \times 10^{11}$ to $1 \times 10^{13}$. The doping of channel region 18 is particularly crucial to the eventual electrical characteristics of the thin film transistor. As the doping dosage increases, the off-state leakage current which is able to flow through channel region 18 between source 16 and drain 17 decreases. However, there is threshold in the dosage level above which the leakage current rapidly increases. Since it is crucial to minimize this leakage current, it is important to approach but not exceed this threshold. In the particular embodiment of the present invention being described, this threshold is in the range of $0.4-6 \times 10^{12}$.

An alternate method which may be used to reduce leakage current is to counter the effects of the phosphorous dopant with ion implantation of boron. As with the above-described channel doping process, this counter-doping may be either masked or maskless. Beam energies of 80–140 KeV are typical. The boron dopant concentration may vary widely with other process variations, but $1-8 \times 10^{11}$ is typical.

It is also possible to separately dope offset regions 19 and 20. In one embodiment of the present invention, offset regions 19 and 20 are doped to a concentration of $1-5 \times 10^{11}$ using phosphorous as the source and an ion beam energy of approximately 120 KeV. Of course, suitable photoresist masking steps are required to apply this doping only to offset regions 19 and 20.

Referring now to FIG. 3, a subsequently intermediate stage in the processing of the thin film transistor is illustrated in cross-section. Once polysilicon layer 15 has been deposited and all of the ion implantation steps completed, a gate dielectric material 21 is deposited overlaying the entire existing structure. In a particular embodiment of the present invention, gate dielectric material 21 comprises a low temperature silicon dioxide layer. Layer 21 is approximately 2,000 Angstroms thick and is deposited by conventional LPCVD processes at approximately 420° C. Layer 21 is undoped.

The next step in the process is to anneal the gate dielectric material. This step in the process is particularly critical since oxidation of lead in PLZT substrate 10 must be avoided. In addition, drastic changes in the temperature of substrate 10 must be avoided. A conventional furnace is brought to a temperature of approximately 400° C. The PLZT wafers are very slowly pushed into the furnace at this temperature. A push rate of approximately 0.10 feet per minute is acceptable. Once the entire set of wafers is within the furnace, the temperature is ramped to approximately 840° C. at a rate of approximately 20° C. per minute. Once this temperature is reached, an atmosphere of oxygen with an addition of trichlorethane is used to anneal the wafers for approximately 10 minutes. This is followed by anneal in an atmosphere of oxygen alone for approximately 60 minutes. Finally, an anneal in a nitrogen atmosphere for approximately 60 minutes is used. The furnace is then allowed to ramp down to approximately 400° C. Then the wafers are slowly pulled from the furnace at approximately the same rate as above.

An alternate gate anneal cycle which uses less time for each stage of the cycle may be employed when a higher mobility polysilicon converted from amorphous is used. For instance, when the 580° C. LPCVD amorphous silicon is deposited, it is found that shorter gate anneal cycles are appropriate. In addition, the oxidizing ambient may be modified to include steam as well as dry oxygen. Other gases, such as argon, may be appropriate for the inert atmosphere portion of the cycle.

After the gate anneal step, areas of gate dielectric 21 must be removed to allow contacts to source region 16 and drain region 17. This is accomplished with conventional photoresist and reactive ion etching techniques.

Once gate dielectric material layer 21 has been opened over source 16 and drain 17, a metal layer is evaporated overlaying dielectric layer 21 and is patterned to define a source electrode 25, a drain electrode 26 and a gate electrode 27. As is apparent, gate electrode 27 does not extend over the entirety of channel region 18. Thus, offset regions 19 and 20 are defined as those portions of channel region 18 which do not underlie gate electrode 27.

The metal deposition and patterning steps used to produce electrodes 25, 26 and 27 are conventional. In a particular embodiment of the invention. The metal is aluminum and 1½% silicon evaporated onto the wafers at a wafer temperature of approximately 400° C. The metal is deposited to a thickness of approximately 10,000 Angstroms.

Referring now to FIG. 4, the final steps in the process of making a high voltage thin film transistor on a PLZT substrate 10 are illustrated in cross-section. In a particular embodiment of the present invention. The steps of depositing a silicon nitride passivation layer 30 overlying the entire structure to this point and the step of annealing the metal layer just deposited are combined. First, an annealing step comprising exposure of the structure to an NH$_3$ plasma for approximately 10 minutes at a temperature of approximately 300° C. is performed. This is immediately followed by the plasma deposition of silicon nitride passivation layer 30. Nitride passivation layer 30 is approximately 4,000 Angstroms in thickness. It is also possible to eliminate the annealing step at this point in the process and perform it later. The deposition of nitride passivation layer 30 must be carried out in such a manner that layer 30 does not have significant tensile stress. It has been found that if layer 30 is deposited with compressive stress the transistor characteristics are not substantially affected. However, if layer 30 has significant tensile stress, the characteristics of the transistor are adversely affected. It has been found that plasma nitride deposition processes using equipment which operates in the KHz frequency range is best for these purposes. Equipment which uses the common 13.56 MHz frequency tends to deposit nitride which adversely effects device performance. After the deposition of nitride passivation layer 30, a front side light shield 31 is deposited to perform a function similar to first polysilicon layer 13. Front side light shield 31 may be a layer of metal approximately 10,000 Angstroms in thickness evaporated at approximately 400° C. In some cases, it may be found that a front side light shield is not needed.

Besides the factors discussed above, the other crucial considerations in design of a thin film transistor are the physical dimensions. In the case of a transistor according to the principles of the present invention, the important dimensions are the width and overall length of the channel region and the length of the offset portions of the channel region. While these dimensions may vary widely, it has been found that a width of 0.25–3.6 mils combined with an overall channel length of 0.4–1.2 mils and an offset length of 0.0–0.8 mils is advantageous.

Up to this point, a method and structure useful for fabricating high voltage thin film transistors on PLZT substrates has been shown and described. It has been found possible to reliably fabricate thin film transistors capable of withstanding in excess of 60 volts between source and drain, having a ratio of on to off current on the order of $10^3$ and operating at a threshold of approximately 15 volts. With such a device, it becomes feasible to fabricate matrix displays with integrated switching devices on PLZT substrates.

Various modifications and changes in the preferred embodiment described above will be apparent to one skilled in the art.

We claim:

1. A method of fabricating a thin film transistor on a PLZT substrate comprising the steps of:
   depositing a first dielectric layer overlying said substrate;
   depositing a polysilicon layer overlying said first dielectric layer;
   defining source and drain regions in said polysilicon layer by placing a dopant therein, said source and drain regions being separated by a channel region of said polysilicon layer;
   depositing a second dielectric layer overlying said polysilicon;
   annealing said second dielectric layer in a an atmosphere that is nonoxidizing to said PLZT;
   depositing source and drain electrodes overlying said second dielectric layer, said source and drain electrodes penetrating said second dielectric layer to contact said source and drain regions, respectively; and
   depositing a gate electrode overlying said second dielectric layer and at least a portion of said channel region.

2. A method according to claim 1 further comprising the steps of:
   placing a dopant in said channel region to a concentration in the range of $4 \times 10^{11}$ to $1 \times 10^{13}$ per square centimeter.

3. A method according to claim 1 wherein:
   said channel region further comprises a pair of offset regions adjacent source and drain regions and not underlying said gate electrode.

4. A method according to claim 1 wherein said step of depositing said polysilicon layer further comprises the steps of:
   depositing a layer of amorphous silicon; and
   heating said amorphous silicon to change it to polysilicon.

5. A method according to claim 1 further comprising the step of:

forming a first conductive light shield underlying said polysilicon layer.

6. A method according to claim 1 further comprising the step of:

depositing a passivation layer overlying said second dielectric layer and said electrodes, said passivation layer not being in a state of significant tensile stress.

* * * * *